United States Patent
Sun et al.

(10) Patent No.: US 10,496,868 B2
(45) Date of Patent: Dec. 3, 2019

(54) OPTICAL DETECTOR, FABRICATION METHOD THEREOF, FINGERPRINT RECOGNITION SENSOR, AND DISPLAY DEVICE

(71) Applicant: BOE TECHNOLOGY GROUP CO., LTD., Beijing (CN)

(72) Inventors: Jianming Sun, Beijing (CN); Ce Ning, Beijing (CN); Wenlin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 96 days.

(21) Appl. No.: 15/745,048

(22) PCT Filed: Sep. 5, 2017

(86) PCT No.: PCT/CN2017/100462
§ 371 (c)(1),
(2) Date: Jan. 15, 2018

(87) PCT Pub. No.: WO2018/166148
PCT Pub. Date: Sep. 20, 2018

(65) Prior Publication Data
US 2019/0012508 A1    Jan. 10, 2019

(30) Foreign Application Priority Data

Mar. 13, 2017  (CN) .......................... 2017 1 0144824

(51) Int. Cl.
*G02B 6/132*  (2006.01)
*G02F 1/1343*  (2006.01)
(Continued)

(52) U.S. Cl.
CPC ........... *G06K 9/0004* (2013.01); *G02B 6/132* (2013.01); *G02F 1/1343* (2013.01); *H01L 21/44* (2013.01);
(Continued)

(58) Field of Classification Search
None
See application file for complete search history.

(56) References Cited

U.S. PATENT DOCUMENTS 6,277,668 B1   8/2001   Goossen et al.
7,897,108 B1   3/2011   Titus et al.
(Continued)

FOREIGN PATENT DOCUMENTS

CN   102324445 A    1/2012
EP    2375242 A1   10/2011

OTHER PUBLICATIONS

International Search Report & Written Opinion dated Nov. 22, 2017, regarding PCT/CN2017/100462.

*Primary Examiner* — Soo Shin
(74) *Attorney, Agent, or Firm* — Intellectual Valley Law, P.C.

(57) ABSTRACT

An optical detector includes a stacked structure, an active layer, a gate insulating layer, and a gate electrode. The stacked structure includes a first electrode, a photoelectric conversion layer, a second electrode, a first insulating layer, and a third electrode. The active layer is electrically coupled to one of the first electrode or the second electrode, and electrically coupled to the third electrode. The gate insulating layer is arranged on the active layer. The gate electrode is arranged on the gate insulating layer.

13 Claims, 6 Drawing Sheets

(51) Int. Cl.
  *G06K 9/00*    (2006.01)
  *H01L 21/44*   (2006.01)
  *H01L 21/82*   (2006.01)
  *H01L 27/12*   (2006.01)
  *H01L 27/144*  (2006.01)
  *H01L 27/146*  (2006.01)
  *H04N 5/225*   (2006.01)

(52) U.S. Cl.
  CPC .......... *H01L 21/82* (2013.01); *H01L 27/1255* (2013.01); *H01L 27/146* (2013.01); *H04N 5/2254* (2013.01)

(56) References Cited

U.S. PATENT DOCUMENTS

| | | | |
|---|---|---|---|
| 8,242,837 B2* | 8/2012 | Yamazaki | H04M 1/0266 327/581 |
| 8,981,374 B2* | 3/2015 | Kubota | H01L 29/41733 257/43 |
| 9,627,418 B2* | 4/2017 | Yamazaki | H01L 27/1251 |
| 9,685,560 B2* | 6/2017 | Yamazaki | H01L 29/7869 |
| 9,911,755 B2* | 3/2018 | Yamazaki | H01L 27/1248 |
| 10,050,152 B2* | 8/2018 | Yamazaki | H01L 27/1225 |
| 2005/0275053 A1 | 12/2005 | Shimizu et al. | |
| 2013/0148126 A1 | 6/2013 | Walters et al. | |
| 2015/0348975 A1* | 12/2015 | Tamura | H01L 27/1052 257/43 |
| 2017/0025415 A1* | 1/2017 | Kurokawa | H01L 27/1052 |
| 2018/0060641 A1* | 3/2018 | Kim | G06K 9/00013 |

\* cited by examiner

OPTICAL DETECTOR, FABRICATION METHOD THEREOF, FINGERPRINT RECOGNITION SENSOR, AND DISPLAY DEVICE

CROSS-REFERENCE TO RELATED APPLICATION

This PCT patent application is a national stage application under 35 U.S.C. § 371 of International Application No. PCT/CN2017/100462, filed Sep. 5, 2017, which claims priority to Chinese Patent Application No. 201710144824.X, filed on Mar. 13, 2017, the entire contents of which are incorporated herein by reference.

TECHNICAL FIELD

The present disclosure generally relates to the field of display technologies and, more particularly, to an optical detector, a fabrication method thereof, a fingerprint recognition sensor, and a display device.

BACKGROUND

Some detectors, such as X-ray detectors or optical detectors in sensors for fingerprint recognition, may require a relatively high detection sensitivity. Examples of such sensors include optical detectors integrated in thin-film-transistor liquid-crystal-display (TFT-LCD) display screens, and further, optical detectors integrated in high pixels-per-inch (PPI) TFT-LCD display screens. A high detection sensitivity in an optical detector requires a large-area photosensitive region, i.e., a high aperture opening ratio of the corresponding array.

SUMMARY

In one aspect, the present disclosure provides an optical detector. The optical detector includes a stacked structure, an active layer, a gate insulating layer, and a gate electrode. The stacked structure includes a first electrode, a photoelectric conversion layer, a second electrode, a first insulating layer, and a third electrode. The active layer is electrically coupled to one of the first electrode or the second electrode, and electrically coupled to the third electrode. The gate insulating layer is arranged on the active layer. The gate electrode is arranged on the gate insulating layer.

Another aspect of the present disclosure provides a method for fabricating an optical detector. The method includes fabricating a stacked structure on a substrate, where the stacked structure includes a first electrode, a photoelectric conversion layer, a second electrode, a first insulating layer, and a third electrode; fabricating an active layer electrically coupled to one of the first electrode or the second electrode, electrically coupled to the third electrode, and electrically insulated from the photoelectric conversion layer; fabricating a gate insulating layer on the active layer; and fabricating a gate electrode on the gate insulating layer.

BRIEF DESCRIPTION OF THE FIGURES

The following drawings are merely examples for illustrative purposes according to various disclosed embodiments and are not intended to limit the scope of the present disclosure.

Figure 1A:
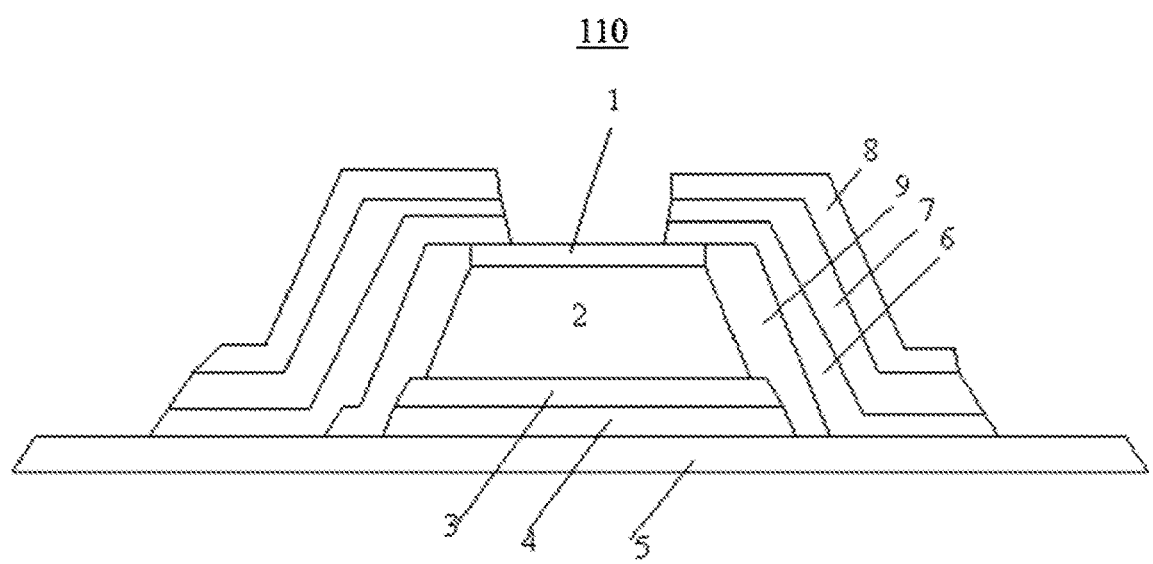
FIG. 1A illustrates a schematic view of an exemplary optical detector according to various disclosed embodiments of the present disclosure.

Reference numerals used in the drawings include: 1, first electrode; 2, photoelectric conversion layer; 3, second electrode; 4, first insulating layer; 5, third electrode; 6, 6', active layer, 7, 7', gate insulating layer; 8, 8', gate electrode; 9, second insulating layer; 110, optical detector; 200, optical detector, 300, fabrication method; 500, fabrication method 600, fingerprint recognition sensor, 601, optical detector; 602, touch surface; 700, display device; 701, fingerprint recognition sensor; and 702, screen.

DETAILED DESCRIPTION

Exemplary embodiments of the disclosure will now be described in more detail with reference to the drawings. It is to be noted that, the following descriptions of some embodiments are presented herein for purposes of illustration and description only, and are not intended to be exhaustive or to limit the scope of the present disclosure.

The aspects and features of the present disclosure can be understood by those skilled in the art through the exemplary embodiments of the present disclosure further described in detail with reference to the accompanying drawings.

An optical detector may generally include a thin-film-transistor (TFT) switch and a photoelectric conversion unit, e.g., a photodiode. A source electrode of the TFT switch may be coupled to a positive electrode of the photodiode. In optical detectors in the existing technology, generally, photodiodes and TFT switches may occupy relatively large areas, resulting in a small-area photosensitive region. As a result, the sensitivities of the optical detectors in the existing technology cannot meet requirements.

Figure 1B:
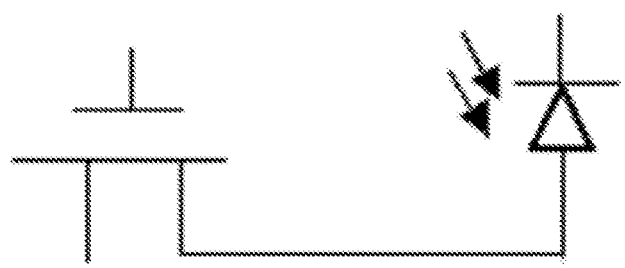
FIG. 1B illustrates a circuit diagram of an operating principle of the exemplary optical detector shown in FIG. 1A.

FIG. 1A illustrates a schematic view of an exemplary optical detector 110 according to various disclosed embodiments of the present disclosure. FIG. 1B illustrates a circuit diagram showing an operating principle of the exemplary optical detector in FIG. 1A. As shown in FIGS. 1A-1B, the optical detector 110 includes a stacked structure including a first electrode 1, a photoelectric conversion layer 2, a second electrode 3, a first insulating layer 4, and a third electrode 5 sequentially stacked, in which the third electrode is at the bottom. The optical detector 110 further includes an active layer 6, a gate insulating layer 7, and a gate electrode 8.

The first electrode 1 and the second electrode 3 serve as two working electrodes for the photoelectric conversion layer 2. Further, the first electrode 1 serves as a light entry electrode, i.e., an electrode through which the incident optical signal enters the photoelectric conversion layer 2. The first electrode 1 may generally include a transparent electrode that allows optical signals to pass through. That is, the first electrode 1, the photoelectric conversion layer 2, and the second electrode 3 form a photoelectric conversion unit.

Further, the first electrode 1 and the third electrode 5 serve as a first one and a second one of a source electrode and a drain electrode, respectively. The gate insulating layer 7 is arranged over the active layer 6. The gate electrode 8 is arranged over the gate insulating layer 7.

In some embodiments, the active layer 6 is electrically coupled to the first electrode 1 and the third electrode 5. The optical detector further includes a second insulating layer 9 arranged between the active layer 6 and the photoelectric conversion layer 2/the second electrode 3.

In some embodiments, referring to FIGS. 1A-1B, the second insulating layer 9 is arranged over a side wall of the photoelectric conversion layer 2, and a side wall of the second electrode 3. The active layer 6 is formed over an edge region of an upper surface of the first electrode 1, the second insulating layer 9, and the third electrode 5, such that the active layer 6 can be electrically coupled to the first electrode 1 and the third electrode 5, and can be electrically insulated from the photoelectric conversion layer 2 and the second electrode 3.

In addition, the active layer 6, the gate insulating layer 7, and the gate electrode 8 are arranged on two opposite sides of the stacked structure, such as the left and right sides of the stacked structure in FIG. 1A.

In some embodiments, the first electrode 1, the photoelectric conversion layer 2, the second electrode 3, the first insulating layer 4, and the third electrode 5 may be sequentially stacked. One of the stacked first electrode 1 and third electrode 5 may serve as the source electrode of the TFT switch and the other one of the stacked first electrode 1 and third electrode 5 may serve as the drain electrode of the TFT switch. That is, the photoelectric conversion unit and the source electrode and the drain electrode of the TFT switch can be superimposed in a same vertical direction. Thus, the areas occupied by the photoelectric conversion unit and the TFT switch can be reduced, the area of the photosensitive region of the optical detector can be increased, and, accordingly, the sensitivity of the optical detector can be improved.

Figure 2:
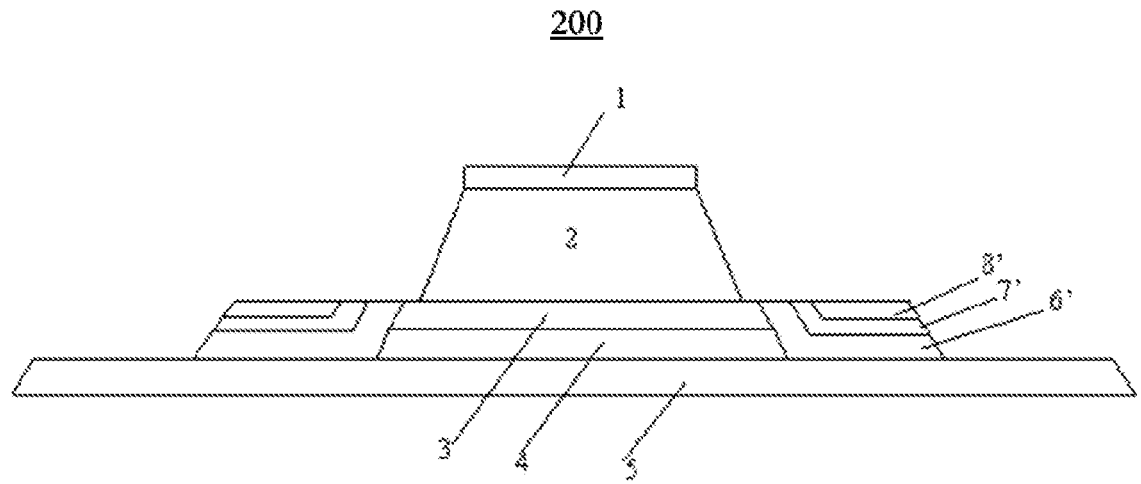
FIG. 2 illustrates a schematic view of another exemplary optical detector according to various disclosed embodiments of the present disclosure.

FIG. 2 illustrates a schematic view of another exemplary optical detector according to various disclosed embodiments of the present disclosure. Certain similar aspects between FIG. 2 and FIG. 1A are not repeated, while certain different aspects are explained. As shown in FIG. 2, similar to the exemplary optical detector 110 shown in FIG. 1A, the exemplary optical detector 200 shown in FIG. 2 includes the first electrode 1, the photoelectric conversion layer 2, the second electrode 3, the first insulating layer 4, the third electrode 5, an active layer 6', a gate insulating layer 7', and a gate electrode 8'. The corresponding positional relationship and the function that have been described above will not be repeated here.

The difference between the optical detector 110 in FIG. 1A and the optical detector 200 in FIG. 2 will now be described. In some embodiments, in the optical detector 200 in FIG. 2, the second electrode 3 and the third electrode 5 serve as a first one and a second one of a source electrode and a drain electrode, respectively. In some embodiments, as shown in FIG. 2, the active layer 6' is electrically coupled to the second electrode 3 and the third electrode 5. The active layer 6' is formed over a side wall of the second electrode 3, a sidewall of the first insulating layer 4, and over the third electrode 5, without touching the photoelectric conversion layer 2 or the first electrode 1. Accordingly, the active layer 6' can be electrically insulated from the photoelectric conversion layer 2 and the first electrode 1.

In some embodiments, the first electrode 1, the photoelectric conversion layer 2, the second electrode 3, the first insulating layer 4, and the third electrode 5 may be sequentially stacked. One of the stacked second electrode 3 and third electrode 5 may serve as the source electrode of the TFT switch, and the other one of the stacked second electrode 3 and third electrode 5 may serve as the drain electrode of the TFT switch. That is, the photoelectric conversion unit and the source electrode and the drain electrode of the TFT switch can be superimposed in a same vertical direction. Thus, the areas occupied by the photoelectric conversion unit and the TFT switch can be reduced, the area of the photosensitive region of the optical detector can be increased and, accordingly, the sensitivity of the optical detector can be improved.

Figure 3:
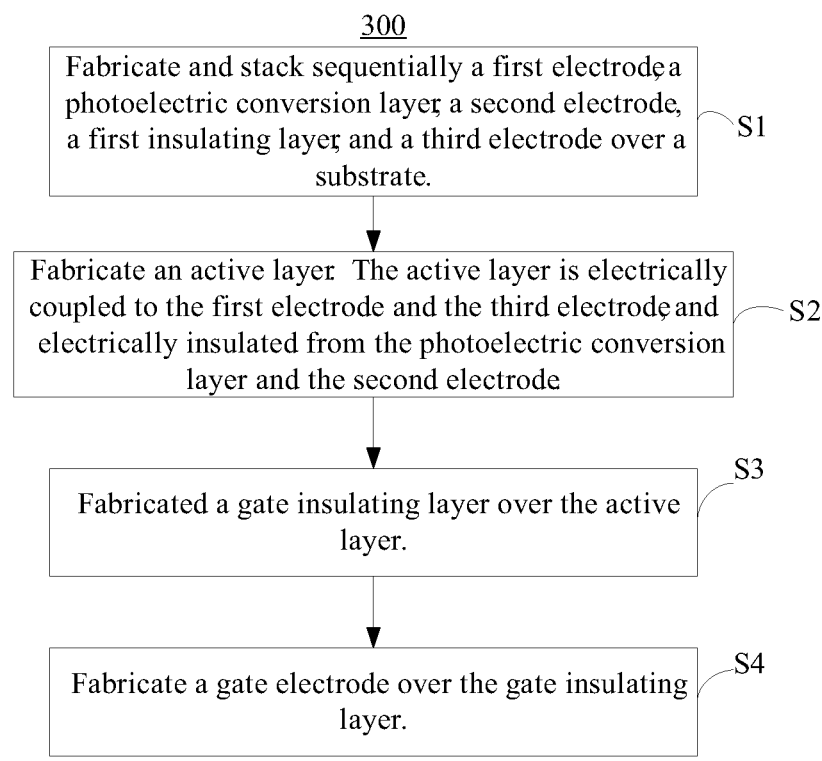
FIG. 3 illustrates a flow chart of an exemplary fabrication method for an exemplary optical detector according to various disclosed embodiments of the present disclosure.

FIG. 3 illustrates a flow chart of an exemplary fabrication method 300 for an exemplary optical detector according to various disclosed embodiments of the present disclosure. With reference to FIG. 3, the exemplary fabrication method 300 for the exemplary optical detector will be described.

At S1, a first electrode, a photoelectric conversion layer, a second electrode, a first insulating layer, and a third electrode are fabricated and stacked sequentially over a substrate.

At S2, an active layer is fabricated. The active layer is electrically coupled to the first electrode and the third electrode, and electrically insulated from the photoelectric conversion layer and the second electrode.

At S3, a gate insulating layer is fabricated over the active layer.

At S4, a gate electrode is fabricated over the gate insulating layer.

In some embodiments, S1 may include, but not limited to, the following.

A third electrode material layer, a first insulating layer material layer, a second electrode material layer, a photoelectric conversion material layer and a first electrode material layer are formed over the substrate; and the third electrode, the first insulating layer, the second electrode, the photoelectric conversion layer, and the first electrode are formed using a patterning process, such as a patterning process using one mask.

Figure 4A:
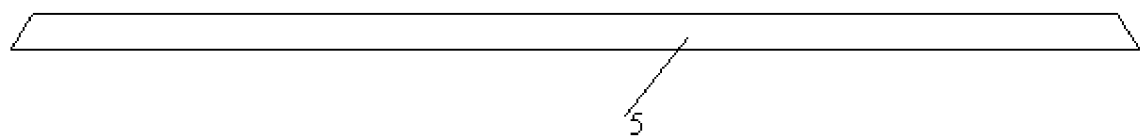
FIGS. 4A-4F illustrate schematic views of exemplary process states after completing different phases of the exemplary fabrication method for the exemplary optical detector in FIG. 3 according to various disclosed embodiments of the present disclosure.

In some embodiments, S1 can also be performed in the following manner. The third electrode material layer is formed over the substrate using one or more techniques including, but not limited to, a sputter technique. The third electrode 5 is formed based on the third electrode material layer by using a patterning process including, but not limited to, photolithography-wet etching techniques, as shown in FIG. 4A. In the photolithography-wet etching, a photoresist is formed over the material layer to be patterned, the photoresist is exposed and developed using a mask having a pattern corresponding to the desired pattern for the material layer, and then the desired pattern can be obtained by wet etching. The third electrode material layer may include, but not limited to, a Mo material layer.

Figure 4B:
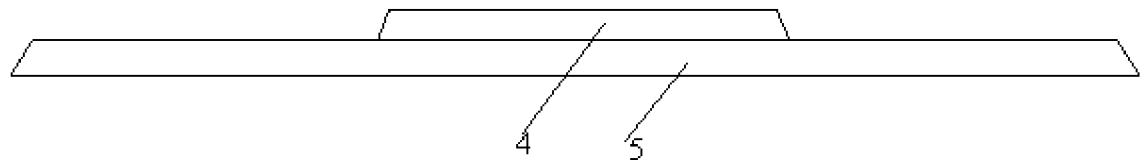

Next, the first insulating layer material layer is formed over the substrate over which the third electrode 5 has been formed, using one or more techniques including, but not limited to, a plasma enhanced chemical vapor deposition (PECVD) technique. Then, as shown in FIG. 4B, the first insulating layer 4 is formed based on the first insulating layer material layer by using a patterning process including, but not limited to, photolithography-dry etching techniques. In the photolithography-dry etching, a photoresist is formed over the material layer to be patterned, the photoresist is exposed and developed using a mask having a pattern corresponding to the desired pattern for the material layer, and then the desired pattern can be obtained by dry etching.

Figure 4C:
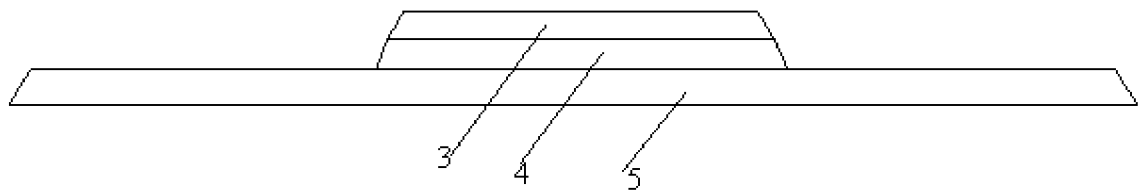

Next, the second electrode material layer is formed over the substrate over which the first insulating layer 4 has been formed. As shown in FIG. 4C, the second electrode 3 is formed based on the second electrode material layer using a patterning process. The process of forming the second electrode 3 is similar to the process of forming the third electrode 5, which will not be further described here.

Next, the photoelectric conversion material layer is formed over the substrate over which the second electrode 3 has been formed, using one or more techniques including, but not limited to, a plasma enhanced chemical vapor deposition (PECVD) technique. Then, the photoelectric conversion layer 2 is formed based on the photoelectric conversion material layer using a patterning process including, but not limited to, photolithography-wet etching techniques.

Figure 4D:
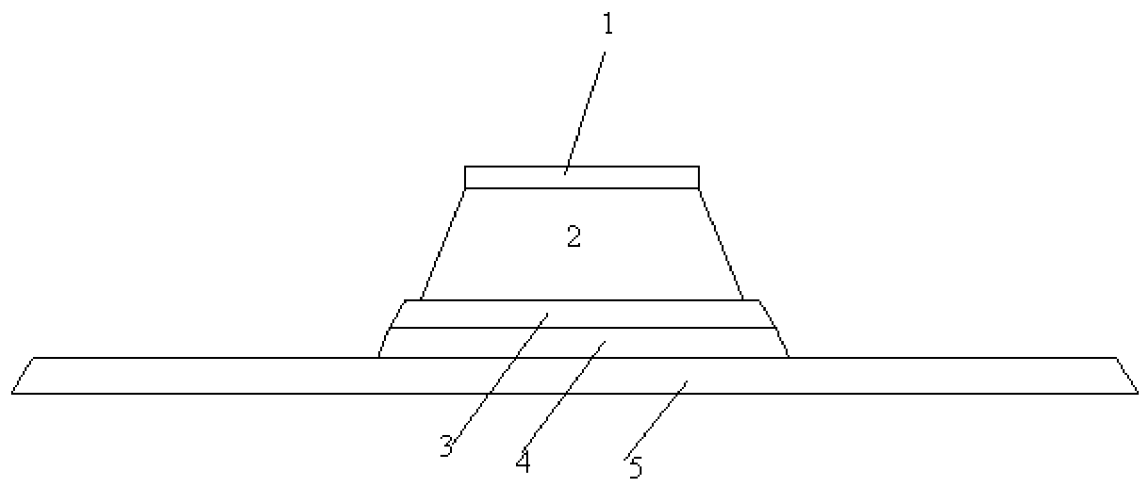

Next, the first electrode material layer is formed over the substrate over which the photoelectric conversion layer 2 has been formed, using one or more techniques including, but not limited to, a sputter technique. Then, as shown in FIG. 4D, the first electrode 1 is formed based on the first electrode material layer using a patterning process including, but not limited to, photolithography-dry etching techniques.

Figure 4E:
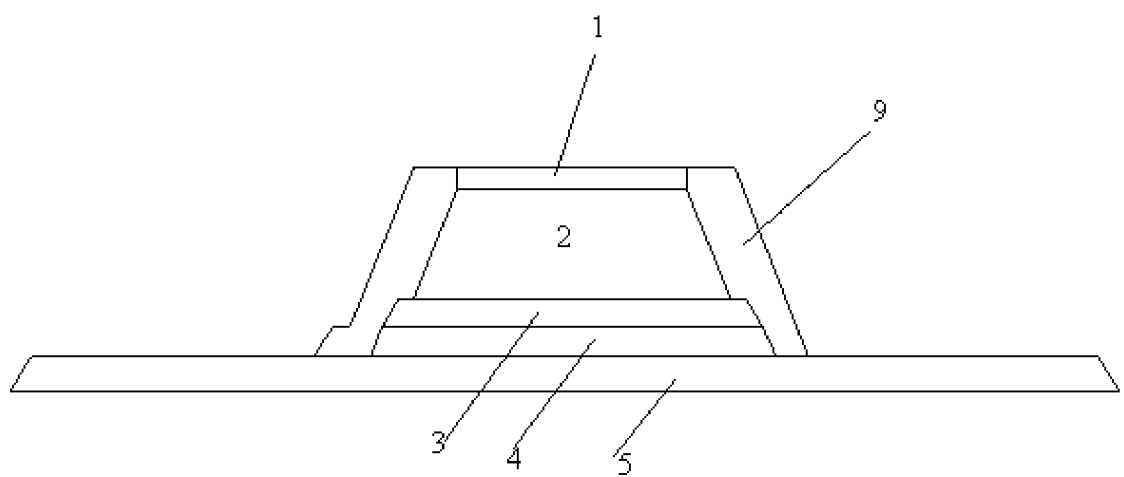

In addition, S2 may include: forming a second insulating layer 9 over a side wall of the photoelectric conversion layer 2 and a side wall of the second electrode 3, as shown in FIG. 4E; and forming the active layer 6 over an edge portion of an upper surface of the first electrode 1, the second insulating layer 9, and the third electrode 5. The active layer 6 such formed can be electrically coupled to the first electrode 1 and the third electrode 5, and be electrically insulated from the photoelectric conversion layer 2 and the second electrode 3.

In some embodiments, S2 may include, but not limited to, the following.

A second insulating material layer is formed over the substrate over which the first electrode 1 has been formed, using one or more techniques including, but not limited to, a plasma enhanced chemical vapor deposition (PECVD) technique. Then, the second insulating layer 9 is formed based on the second insulating material layer using a patterning process including, but not limited to, photolithography-dry etching techniques.

The active material layer is formed over the substrate over which the second insulating layer 9 has been formed, using one or more techniques including, but not limited to, a sputter technique. Then, the active layer 6 is formed based on the active material layer, using a patterning process including, but not limited to, photolithography-dry etching techniques.

In some embodiments, S3 may include, but not limited to, the following.

Figure 4F:
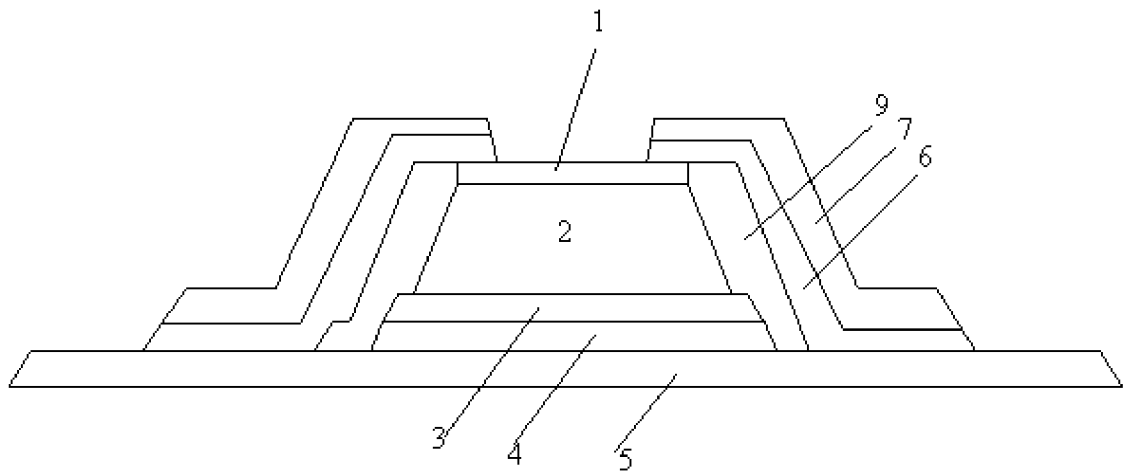

The gate insulating material layer is formed over the substrate over which the active layer 6 has been formed, using one or more techniques including, but not limited to, a plasma enhanced chemical vapor deposition (PECVD) technique. Then, as shown in FIG. 4F, the gate insulating layer 7 is formed based on the gate insulating material layer using a patterning process including, but not limited to, photolithography-wet etching techniques. The gate insulating material layer may include, but not limited to, a silicon dioxide ($SiO_2$) material layer.

In some embodiments, S4 may include, but not limited to, the following.

The gate electrode material layer is formed over the substrate over which the gate insulating layer 7 has been formed, using one or more techniques including, but not limited to, a sputter technique. Then, as shown in FIG. 1A, the gate electrode 8 is formed based on the gate electrode material layer using a patterning process including, but not limited to, photolithography-wet etching techniques. The gate electrode material layer may include, but not limited to, a Mo material layer.

Figure 5:
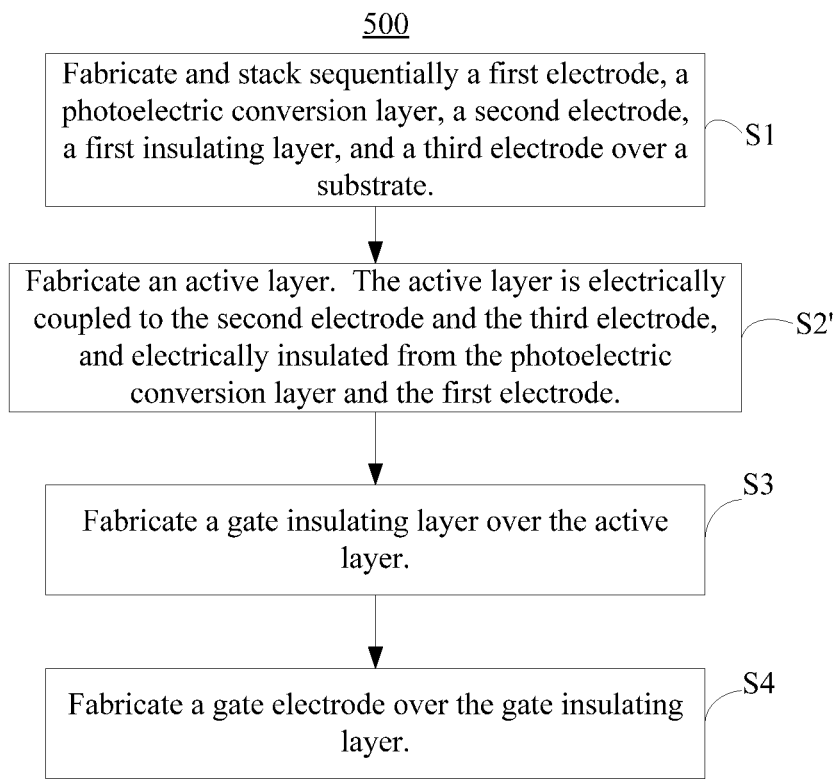
FIG. 5 illustrates a flow chart of another exemplary fabrication method for an exemplary optical detector according to various disclosed embodiments of the present disclosure.

FIG. 5 illustrates a flow chart of another exemplary fabrication method 500 for an exemplary optical detector according to various disclosed embodiments of the present disclosure. The exemplary fabrication method 500 for the exemplary optical detector is similar to the exemplary fabrication method 300 shown in FIG. 3, but differs in forming the active layer. As shown in FIG. 5, the exemplary fabrication method 500 includes processes S1, S2', S3, and S4. The processes S1, S3, and S4 in the exemplary fabrication method 500 are similar to those in the exemplary fabrication method 300, and detailed description thereof is omitted.

In some embodiments, as shown in FIG. 5, at S2', an active layer is fabricated, such that the active layer is electrically coupled to the second electrode and the third electrode, and is electrically insulated from the photoelectric conversion layer and the first electrode.

For example, S2' in the exemplary fabrication method 500 includes: forming the active layer 6' over a side wall of the second electrode 3, a side wall of the first insulating layer 4, and the third electrode 5, as shown in FIG. 2.

Figure 6:
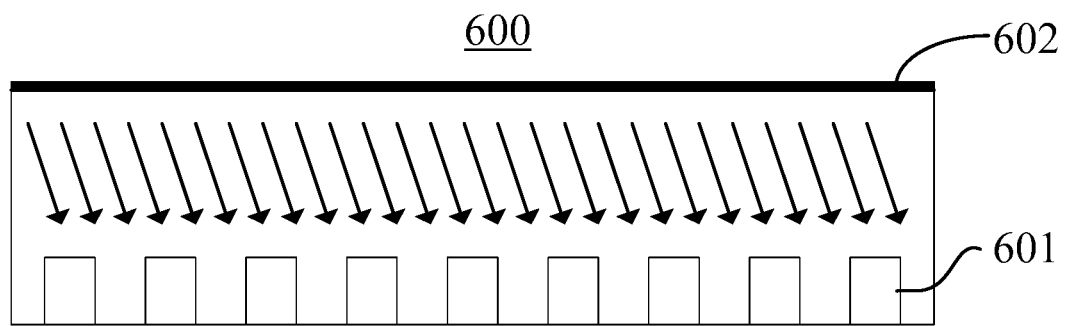
FIG. 6 illustrates a schematic view of an exemplary fingerprint recognition sensor according to various disclosed embodiments of the present disclosure.

The present disclosure also provides a fingerprint recognition sensor comprising at least one optical detector consistent with the present disclosure, such as the optical detector shown in FIG. 1A or the optical detector shown in FIG. 2. FIG. 6 illustrates a schematic view of an exemplary fingerprint recognition sensor 600 according to various disclosed embodiments of the present disclosure. As shown in FIG. 6, the exemplary fingerprint recognition sensor 600 includes at least one optical detector 601 consistent with the present disclosure. Arrows shown in FIG. 6 indicate light entering the at least one optical detector 601. In addition to the at least one optical detector 601 consistent with the disclosure, the fingerprint recognition sensor 600 may further include other suitable structures, such as a touch surface 602, as shown in FIG. 6. The touch surface 602 is a surface for placing at least one finger, such that a fingerprint of the at least one finger can be acquired by the fingerprint recognition sensor 600. The optical detector 601 can be any optical detector consistent with the present disclosure, such as one of the above-described exemplary optical detectors. Any fingerprint recognition sensor including at least one optical detector consistent with the present disclosure is within the scope of the present disclosure.

The fingerprint recognition sensor consistent with the present disclosure includes an optical detector consistent with the present disclosure, such as the optical detector shown in FIG. 1A or the optical detector shown in FIG. 2, and thus has an improved accuracy of fingerprint recognition.

Figure 7:
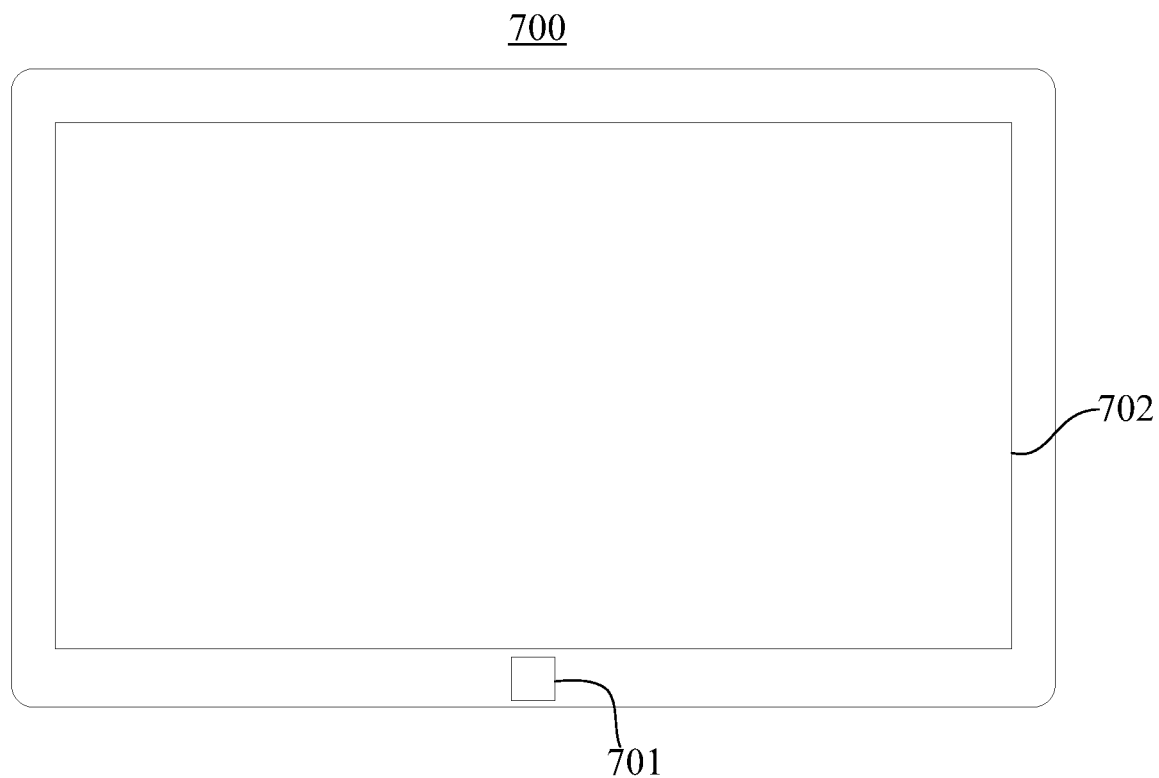
FIG. 7 illustrates a schematic view of an exemplary display device according to various disclosed embodiments of the present disclosure.

The present disclosure provides a display device in which a fingerprint recognition sensor consistent with the disclosure is integrated. FIG. 7 illustrates a schematic view of an exemplary display device 700 according to various disclosed embodiments of the present disclosure. The display device 700 shown in FIG. 7 includes a fingerprint recognition sensor 701 consistent with the disclosure. In addition to the fingerprint recognition sensor consistent with the disclosure, the display device 700 may further include other suitable structures, such as a screen 702, as shown in FIG. 7.

The display device 700 can be, for example, a liquid crystal panel, an electronic paper, an organic light-emitting diode (OLED) panel, an active-matrix organic light-emitting diode (AMOLED) panel, a mobile phone, a tablet computer, a television, a monitor, a notebook computer, a digital photo frame, a navigating instrument, or any other suitable products or components having a display function. Any display device including a fingerprint recognition sensor consistent with the disclosure is within the scope of the present disclosure.

The display device consistent with the disclosure includes a fingerprint recognition sensor consistent with the disclosure, which is integrated in the display device, and thus has an improved accuracy of fingerprint recognition.

The present disclosure provides an optical detector. The optical detector may include: a stacked structure including a first electrode, a photoelectric conversion layer, a second electrode, a first insulating layer, and a third electrode sequentially stacked; and further, an active layer, a gate insulating layer, and a gate electrode. One of the first electrode or the second electrode may serve as a first one of a source electrode and a drain electrode. The third electrode may serve as a second one of the source electrode and the drain electrode. The gate insulating layer may be arranged over the active layer. The gate electrode may be arranged over the gate insulating layer. The present disclosure also provides a fabrication method for an optical detector, a fingerprint recognition sensor, and a display device. The present disclosure can increase the area of the photosensitive region of the optical detector, such that the sensitivity of the optical detector can be improved.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to persons skilled in this art. The embodiments are chosen and described in order to explain the principles of the technology, with various modifications suitable to the particular use or implementation contemplated. It is intended that the scope of the invention be defined by the claims appended hereto and their equivalents in which all terms are meant in their broadest reasonable sense unless otherwise indicated. Therefore, the term "the disclosure," "the present disclosure," or the like does not necessarily limit the claim scope to a specific embodiment, and the reference to exemplary embodiments of the disclosure does not imply a limitation on the invention, and no such limitation is to be inferred. Moreover, the claims may refer to "first," "second," etc., followed by a noun or element. Such terms should be understood as a nomenclature and should not be construed as giving the limitation on the number of the elements modified by such nomenclature unless specific number has been given. Any advantages and benefits described may or may not apply to all embodiments of the disclosure. It should be appreciated that variations may be made to the embodiments described by persons skilled in the art without departing from the scope of the present disclosure. Moreover, no element or component in the present disclosure is intended to be dedicated to the public regardless of whether the element or component is explicitly recited in the following claims.

What is claimed is:

1. An optical detector, comprising:
   a stacked structure including a first electrode, a photoelectric conversion layer, a second electrode, a first insulating layer, and a third electrode;
   an active layer electrically coupled to one of the first electrode or the second electrode, and electrically coupled to the third electrode;
   a gate insulating layer on the active layer;
   a gate electrode on the gate insulating layer; and
   a second insulating layer arranged between the active layer and the photoelectric conversion layer, and between the active layer and the second electrode,
   wherein the active layer is electrically coupled to the first electrode and is electrically insulated from the second electrode.

2. The optical detector according to claim 1, wherein:
   the second insulating layer is arranged on a side wall of the photoelectric conversion layer and a sidewall of the second electrode; and
   the active layer is formed on an edge region of an upper surface of the first electrode, the second insulating layer, and the third electrode.

3. The optical detector according to claim 1, wherein:
   each of the active layer, the gate insulating layer, and the gate electrode includes two portions arranged on two opposite sides of the stacked structure.

4. A method for fabricating an optical detector of claim 1, comprising:
   fabricating a stacked structure on a substrate, the stacked structure including a first electrode, a photoelectric conversion layer, a second electrode, a first insulating layer, and a third electrode;
   fabricating an active layer electrically coupled to one of the first electrode or the second electrode, electrically coupled to the third electrode, and electrically insulated from the photoelectric conversion layer;
   fabricating a gate insulating layer on the active layer; and
   fabricating a gate electrode on the gate insulating layer;
   wherein fabricating the active layer includes:
   forming a second insulating layer on a side wall of the photoelectric conversion layer and a sidewall of the second electrode; and
   forming the active layer on an edge region of an upper surface of the first electrode, the second insulating layer, and the third electrode, such that the active layer is electrically coupled to the first electrode and electrically insulated from the second electrode.

5. The method according to claim 4, wherein fabricating the stacked structure includes:
   forming a composite layer including a third electrode material layer, a first insulating layer material layer, a second electrode material layer, a photoelectric conversion material layer, and a first electrode material layer on the substrate; and performing a patterning process on the composite layer to form the third electrode, the first insulating layer, the second electrode, the photoelectric conversion layer, and the first electrode.

6. A fingerprint recognition sensor, comprising the optical detector according to claim 1 and a touch surface.

7. A display apparatus, comprising the fingerprint recognition sensor according to claim 6 and a display panel.

8. An optical detector, comprising:
  a stacked structure including a first electrode, a photoelectric conversion layer, a second electrode, a first insulating layer, and a third electrode;
  an active layer electrically coupled to one of the first electrode or the second electrode, and electrically coupled to the third electrode;
  a gate insulating layer on the active layer; and
  a gate electrode on the gate insulating layer;
  wherein the active layer is electrically coupled to the second electrode and is electrically insulated from the first electrode; and
  the active layer is formed on a sidewall of the second electrode, a sidewall of the first insulating layer, and the third electrode.

9. A method for fabricating an optical detector of claim 8, comprising:
  fabricating a stacked structure on a substrate, the stacked structure including a first electrode, a photoelectric conversion layer, a second electrode, a first insulating layer, and a third electrode;
  fabricating an active layer electrically coupled to one of the first electrode or the second electrode, electrically coupled to the third electrode, and electrically insulated from the photoelectric conversion layer;
  fabricating a gate insulating layer on the active layer; and
  fabricating a gate electrode on the gate insulating layer;
  wherein fabricating the active layer includes:
  forming the active layer on a sidewall of the second electrode, a sidewall of the first insulating layer, and the third electrode, such that the active layer is electrically coupled to the second electrode and electrically insulated from the first electrode.

10. The method according to claim 9, wherein fabricating the stacked structure includes:
  forming a composite layer including a third electrode material layer, a first insulating layer material layer, a second electrode material layer, a photoelectric conversion material layer, and a first electrode material layer on the substrate; and
  performing a patterning process on the composite layer to form the third electrode, the first insulating layer, the second electrode, the photoelectric conversion layer, and the first electrode.

11. The optical detector according to claim 8, wherein:
  each of the active layer, the gate insulating layer, and the gate electrode includes two portions arranged on two opposite sides of the stacked structure.

12. A fingerprint recognition sensor, comprising the optical detector according to claim 8 and a touch surface.

13. A display apparatus, comprising the fingerprint recognition sensor according to claim 12 and a display panel.

* * * * *